(12) United States Patent
Abe

(10) Patent No.: US 9,875,778 B2
(45) Date of Patent: Jan. 23, 2018

(54) SEMICONDUCTOR DEVICE INCLUDING A CLOCK ADJUSTMENT CIRCUIT

(71) Applicant: Micron Technology, Inc., Boise, ID (US)

(72) Inventor: Tsuneo Abe, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 14/555,131

(22) Filed: Nov. 26, 2014

(65) Prior Publication Data

US 2015/0146495 A1 May 28, 2015

(30) Foreign Application Priority Data

Nov. 28, 2013 (JP) .................. 2013-246225

(51) Int. Cl.
*G06F 1/04* (2006.01)
*G11C 8/18* (2006.01)
*G11C 29/02* (2006.01)
*G11C 29/24* (2006.01)
*G11C 7/22* (2006.01)

(52) U.S. Cl.
CPC ............... *G11C 8/18* (2013.01); *G11C 7/222* (2013.01); *G11C 29/023* (2013.01); *G11C 29/028* (2013.01); *G11C 29/24* (2013.01); *G11C 2207/2254* (2013.01)

(58) Field of Classification Search
CPC ..... H03L 7/0814; H03L 7/087; H03L 7/0812; G11C 7/222; G11C 7/22
See application file for complete search history.

(56) References Cited

U.S. PATENT DOCUMENTS

2008/0240327 A1* 10/2008 Kim ........................ G11C 16/32
375/376

FOREIGN PATENT DOCUMENTS

JP       2011-109524        6/2011

* cited by examiner

*Primary Examiner* — Sibin Chen
(74) *Attorney, Agent, or Firm* — Dorsey & Whitney LLP

(57) ABSTRACT

Disclosed herein is an apparatus that includes a clock circuit configured to receive first and second clock signals and perform a phase control operation in which a phase relationship between the first and second clock signals is controlled, the clock circuit configured to initiate the phase control operation each time a first control signal is asserted, the clock circuit including a comparator circuit that is configured to produce a second control signal indicative of a phase difference between the first and second clock signals, and a timing generator configured to assert the first control signal cyclically, the timing generator configured to respond to the second control signal to control a cycle of producing the first control signal.

20 Claims, 14 Drawing Sheets

SEMICONDUCTOR DEVICE INCLUDING A CLOCK ADJUSTMENT CIRCUIT

RELATED REFERENCE

This application is based upon and claims the benefit of priority from Japanese Patent Application No. 2013-246225 filed on Nov. 28, 2013, the disclosure of which are incorporated herein in its entirely by reference.

BACKGROUND

Field of the Invention

The present invention relates to a semiconductor device and particularly relates to a semiconductor device provided with a clock adjustment circuit for controlling the phase of an internal clock signal.

Description of Related Art

A semiconductor device such as a DRAM (Dynamic Random Access Memory) is provided with a clock adjustment circuit such as a DLL (Delay Locked Loop) circuit. For example, a semiconductor device is provided with a DLL circuit which intermittently carries out a phase adjustment operation (Japanese Patent Application Laid Open No. 2011-109524).

SUMMARY

In one embodiment of the disclosure, there is provided an apparatus that includes: a clock circuit configured to receive first and second clock signals and perform a phase control operation in which a phase relationship between the first and second clock signals is controlled, the clock circuit configured to initiate the phase control operation each time a first control signal is asserted, the clock circuit including a comparator circuit that is configured to produce a second control signal indicative of a phase difference between the first and second clock signals; and a timing generator configured to assert the first control signal cyclically, the timing generator configured to respond to the second control signal to control a cycle of producing the first control signal.

In another embodiment of the disclosure, there is provided an apparatus that includes: a DLL (Delayed Locked Loop) circuit configured to perform a DLL operation on first and second clock signals, the DLL circuit configured to initiate the DLL operation each time a first control signal is asserted, the DLL circuit including a phase comparator circuit that is configured to produce a second control signal indicative of a phase difference between the first and second clock signals; and a timing generator configured to make, after making a first assertion of the first control signal, a second assertion of the first control signal in a selected one of first and second time periods, the first and second time periods being different from each other, a selection of the first time period or the second time period being made responsive to the second control signal.

In another embodiment of the disclosure, there is provided a method that includes: making a first assertion of a first control signal; initiating a first phase control operation to control a phase relationship between first and second clock signals responsive to the first assertion of the first control signal; terminating the first phase control operation when the first and second clock signals are in phase; making a second assertion of the first control signal after a first time period when a condition in which the first and second clock signals are out of phase in the first phase control operation continues over a first period, and in a second time when the condition ends within the first period; and initiating a second first phase control operation to control a phase relationship between the first and second clock signals responsive to the second assertion of the first control signal.

BRIEF DESCRIPTION OF THE DRAWINGS

The above features and advantages of the present invention will be more apparent from the following description of certain embodiments taken in conjunction with the accompanying drawings, in which.

DETAILED DESCRIPTION

The invention will be now described herein with reference to illustrative embodiments. Those skilled in the art will recognize that many alternative embodiments can be realized using the teachings of the present invention and that the invention is not limited to the embodiments illustrated for explanatory purposes.

A first embodiment of the present invention will be described below in detail with reference to the accompanying drawings.

Figure 1:
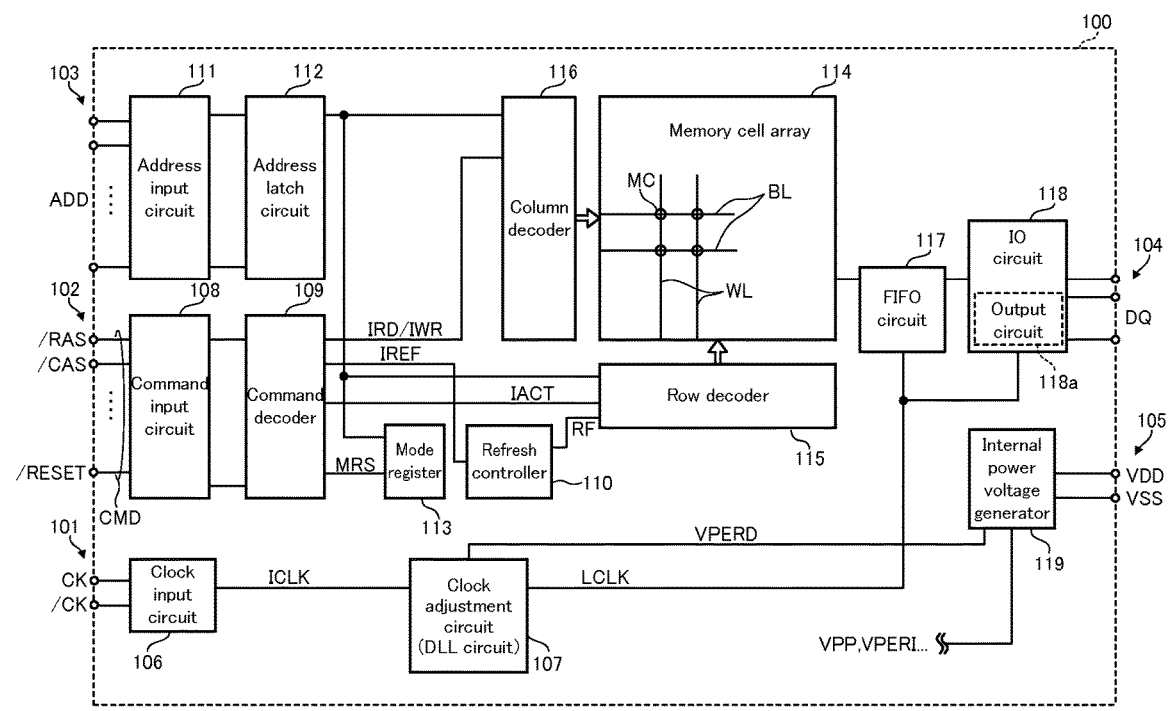
FIG. 1 is a block diagram showing a semiconductor device according to an embodiment of the present invention.

FIG. 1 is a block diagram showing a semiconductor device 100 according to an embodiment of the present invention.

The semiconductor device 100 according to the present embodiment is a DRAM (Dynamic Random Access Memory). However, semiconductor devices according to the present invention are not limited to DRAMs. Therefore, the present invention can be also applied to other semiconductor memory devices such as SRAMs, ReRAMs, and flash memories. Furthermore, the present invention can be also applied to logical semiconductor devices such as CPUs and DSPs.

The semiconductor device 100 includes, as external terminals, a clock terminal group 101, a command terminal group 102, an address terminal group 103, a data-input/output terminal group 104, and a power-source terminal group 105. Moreover, the semiconductor device 100 includes a clock input circuit 106, a clock adjustment circuit 107, a command input circuit 108, a command decoder 109, a refresh controller 110, an address input circuit 111, an address latch circuit 112, a mode register 113, a memory cell array 114, a row decoder 115, a column decoder 116, a FIFO (First-In First-Out) circuit 117, an IO circuit 118, and an internal power voltage generator 119.

The clock terminal group 101 receives external clock signals CK and /CK.

The clock input circuit 106 receives the external clock signals CK and /CK from the clock terminal group 101 and generates internal clock signals ICLK synchronized with the external clock signals CK and /CK by using the external clock signals CK and /CK. The clock input circuit 106 outputs the internal clock signals ICLK to the clock adjustment circuit 107.

The clock adjustment circuit 107 is, for example, a DLL circuit. The clock adjustment circuit 107 generates input/output clock signals LCLK by adjusting the phases of the internal clock signals ICLK. The clock adjustment circuit 107 executes a phase adjustment operation of setting the phase differences between the external clock signals CK and /CB and the input/output clock signals LCLK to a predetermined value. The internal clock signal ICLK is an example of a phase-adjustment target signal, and the input/output clock signal LCLK is an example of the output signal of the clock adjustment circuit 107. The input/output clock signals LCLK generated by the clock adjustment circuit 107 are supplied to the FIFO circuit 117 and the IO circuit 118.

The command terminal group 102 receives command signals CMD. The command signals CMD are, for example, a row-address strobe signal /RAS, a column-address strobe signal /CAS, a reset signal /RESET, etc.

The command input circuit 108 receives the command signals CMD from the command terminal group 102 and outputs the command signals CMD to the command decoder 109.

The command decoder 109 receives the command signals CMD. The command decoder 109 generates internal command signals by carrying out, for example, retention of the command signals, decoding of the command signals, and counting of the command signals. The command decoder 109 generates, as the internal command signals, for example, active commands IACT, read commands IRD, write commands IWR, refresh commands IREF, mode-register-set commands MRS, etc.

The refresh controller 110 receives the refresh commands IREF from the command decoder 109. When the refresh controller 110 receives the refresh commands IREF, the refresh controller 110 supplies refresh signals RF to the row decoder 115.

The address terminal group 103 receives address signals ADD.

The address input circuit 111 receives the address signals ADD from the address terminal group 103 and outputs the address signals ADD to the address latch circuit 112.

The address latch circuit 112 receives the address signals ADD from the address input circuit 111. If the mode-register-set command MRS is activated, the address latch circuit 112 outputs the address signals ADD to the mode register 113. Moreover, the address latch circuit 112 outputs row addresses of the address signals ADD to the row decoder 115 and outputs column addresses of the address signals ADD to the column decoder 116.

The mode register 113 is a register at which operation parameters (for example, a burst length or a CAS latency) of the semiconductor device 100 are set. The mode register 113 receives the mode-register-set command MRS from the command decoder 109 and the address signal ADD from the address latch circuit 112 and sets the operation parameters which are specified based on the mode-register-set command MRS and the address signal ADD.

The memory cell array 114 includes a plurality of word lines WL, a plurality of bit lines BL, and a plurality of memory cells MC. Each of the memory cells MC is specified by the word line WL and the bit line BL.

The row decoder 115 receives the row addresses from the address latch circuit 112 and the active commands IACT from the command decoder 109. Moreover, the row decoder 115 receives the refresh signals RF from the refresh controller 110. When the row decoder 115 receives the active command IACT, the row decoder 115 selects the word line WL corresponding to the row address thereof from among the plurality of word lines WL in the memory cell array 114. When the row decoder 115 receives the refresh signal RF, the row decoder 115 selects the word line WL corresponding to the row address thereof from among the plurality of word lines WL and refreshes the memory cell MC corresponding to the selected word line WL.

The plurality of word lines WL and the plurality of bit lines BL are intersecting with each other in the memory cell array 114, and the memory cells MC are disposed at intersection points thereof. FIG. 1 shows only two word lines WL, two bit lines BL, and four memory cells MC in order to simplify explanation. The bit lines BL are connected to corresponding sense amplifiers (not shown), respectively.

The column decoder 116 receives the column addresses from the address latch circuit 112 and receives the read commands IRD and the write commands IWR from the command decoder 109. When the column decoder 116 receives the column address and the read command IRD or the write command IWR, the column decoder 116 selects the sense amplifier corresponding to the column address from among the plurality of sense amplifiers.

Upon a read operation (upon generation of the read command IRD), data of the plurality of memory cells MC selected by the word lines WL is amplified by the plurality of sense amplifiers, respectively. Among that, the plurality of pieces of the data of the plurality of sense amplifiers selected by the column decoder 116 are output from the data input/output terminals 104 via the FIFO circuit 117 and the IO circuit 118. On the other hand, upon a write operation (upon generation of the write command IWR), a plurality of pieces of data received by the data input/output terminals 104 are written to the plurality of corresponding memory cells MC, respectively, via the IO circuit 118 and the FIFO circuit 117 and further via the plurality of sense amplifiers selected by the column decoder 116, respectively.

The FIFO circuit 117 receives the input/output clock signals LCLK from the clock adjustment circuit 107 and, in synchronization with the input/output clock signals LCLK, exchanges read data DQ and write data DQ between the memory cell array 114 and the IO circuit 118. Particularly, upon a read operation, a plurality of pieces of data parallely read are serially converted, and the opposite is executed in a write operation.

The data-input/output terminal group 104 carries out output of the read data DQ and input of the write data DQ. The data-input/output terminal group 104 is connected to the IO circuit 118.

The I/O circuit 118 receives the input/output clock signals LCLK from the clock adjustment circuit 107. The IO circuit 118 includes an output circuit 118a. The output circuit 118a outputs the read data DQ to the data-input/output terminal group 104 in synchronization with the input/output clock signals LCLK upon the read operation.

The power-source terminal group 105 receives a high-potential-side voltage VDD of a power-source voltage and a low-potential-side voltage VSS of the power-source voltage.

The internal power voltage generator 119 receives the voltage VDD and the voltage VSS from the power-source terminal group 105 and generates internal power-source voltages such as a voltage VPP, a voltage VPERI, and a voltage VPERD.

The voltage VPP is mainly used in the row decoder 115. The voltage VPERD is used as an operating voltage of the clock adjustment circuit 107. The voltage VPERI is used as an operating voltage of many other peripheral circuits.

In the present specification, the signals denoted with "/" at the top of the signal names mean that they are inverted signals or low-active signals of corresponding signals. Therefore, the external clock signal CK and the external clock signal /CK are mutually complementary signals.

Figure 2:
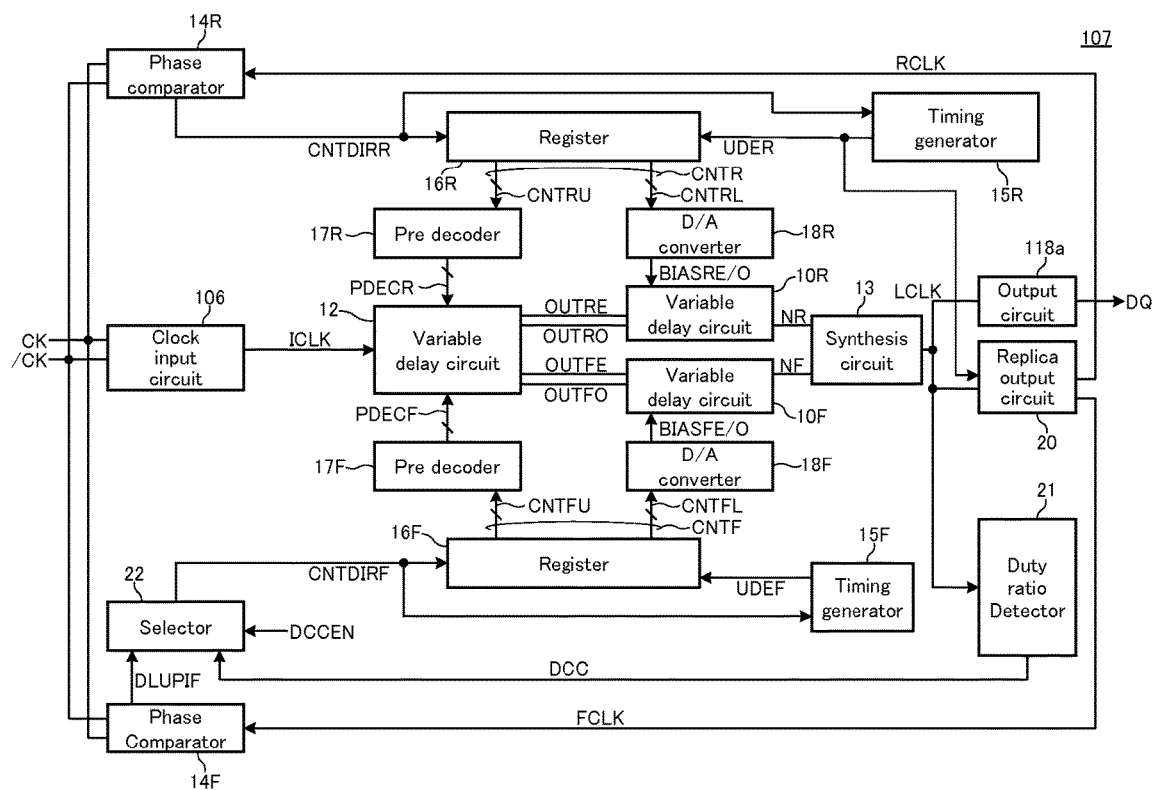
FIG. 2 is a block diagram showing a clock adjustment circuit according to an embodiment of the invention.

FIG. 2 is a block diagram showing a clock adjustment circuit 107 according to an embodiment of the invention.

As shown in FIG. 2, the clock adjustment circuit 107 is provided with variable delay circuits 12, 10R, and 10F.

The variable delay circuit 12 is, for example, a delay line in which a plurality of NAND circuits are connected in series. The variable delay circuit 12 generates intermediate clock signals OUTRE, OUTRO, OUTFE, and OUTFO by delaying the internal clock signals ICLK.

The intermediate clock signals OUTRE and OUTRO are the signals corresponding to rising edges of the internal clock signals ICLK. Herein, the phase difference between the intermediate clock signal OUTRE and the intermediate clock signal OUTRO corresponds to a minimum delay pitch of the variable delay circuit 12. The delay amounts of the intermediate clock signals OUTRE and OUTRO with respect to the rising edges of the internal clock signals ICLK are controlled by pre-decode signals PDECR. The pre-decode signals PDECR are output from a pre decoder 17R.

Intermediate clock signals OUTFE and OUTFO are the signals corresponding to falling edges of the internal clock signals ICLK. Herein, the phase difference between the intermediate clock signal OUTFE and the intermediate clock signal OUTFO corresponds to a minimum delay pitch of the variable delay circuit 12. The delay amounts of the intermediate clock signals OUTFE and OUTFO with respect to the falling edges of the internal clock signals ICLK are controlled by pre-decode signals PDECF. The pre-decode signals PDECF are output from a pre-decoder 17F.

If the variable delay circuit 12 consists of a plurality of NAND circuits, the minimum delay pitch of the variable delay circuit 12 corresponds to a delay amount of two NAND circuits.

The intermediate clock signals OUTRE and OUTRO are input to a variable delay circuit 10R. The variable delay circuit 10R is an interpolator and generates intermediate clock signals NR by synthesizing the intermediate clock signals OUTRE and OUTRO. The synthesis ratio of the intermediate clock signals OUTRE and OUTRO is controlled by bias voltages BIASRE and BIASRO. For example, if the bias voltages BIASRE and BIASRO are at the mutually same level, the synthesis ratio of the intermediate clock signals OUTRE and OUTRO becomes 50:50. In this case, the phase of the intermediate clock signal NR becomes exactly the middle between the phase of the intermediate clock signal OUTRE and the phase of the intermediate clock signal OUTRO. If the bias voltage BIASRE is at a maximum level and the bias voltage BIASRO is at a minimum level, the synthesis ratio of the intermediate clock signals OUTRE and OUTRO becomes 100:0. In this case, the phase of the intermediate clock signal NR matches the phase of the intermediate clock signal OUTRE. Furthermore, if the bias voltage BIASRE is at a minimum level and the bias voltage BIASRO is at a maximum level, the synthesis ratio of the intermediate clock signals OUTRE and OUTRO becomes 0:100. In this case, the phase of the intermediate clock signal NR matches the phase of the intermediate clock signal OUTRO. The bias voltages BIASRE and BIASRO are generated by a D/A converter 18R.

The intermediate clock signals OUTFE and OUTFO are input to the variable delay circuit 10F. The variable delay circuit 10F is an interpolator and generates intermediate clock signals NF by synthesizing the intermediate clock signals OUTFE and OUTFO. The synthesis ratio of the intermediate clock signals OUTFE and OUTFO is controlled by bias voltages BIASFE and BIASFO. For example, if the bias voltages BIASFE and BIASFO are at the mutually same level, the synthesis ratio of the intermediate clock signals OUTFE and OUTFO becomes 50:50. In this case, the phase of the intermediate clock signal NF is exactly the middle between the phase of the intermediate clock signal OUTFE and the phase of the intermediate clock signal OUTFO. If the bias voltage BIASFE is at a maximum level and the bias voltage BIASFO is at a minimum level, the synthesis ratio of the intermediate clock signals OUTFE and OUTFO becomes 100:0. In this case, the phase of the intermediate clock signal NF matches the phase of the intermediate clock signal OUTFE. Furthermore, if the bias voltage BIASFE is at a minimum level and the bias voltage BIASFO is at a maximum level, the synthesis ratio of the intermediate clock signals OUTFE and OUTFO becomes 0:100. In this case, the phase of the intermediate clock signal NF matches the phase of the intermediate clock signal OUTFO. The bias voltages BIASFE and BIASFO are generated by a D/A converter 18F.

The intermediate clock signals NR and NF are input to a synthesis circuit 13. The synthesis circuit 13 generates the input/output clock signals LCLK by synthesizing the intermediate clock signals NR and NF. Specifically, the input/output clock signals LCLK are caused to rise in synchronization with rising edges of the intermediate clock signals NR, and the input/output clock signals LCLK are caused to decay in synchronization with falling edges of the intermediate clock signal NF. The synthesis circuit 13 has, for example, a circuit configuration which is equivalent to a general flip-flop consisting of two inverter circuits connected to establish circulation therebetween.

The input/output clock signals LCLK generated in this manner are supplied to the output circuit 118a as described above. As a result, the read data DQ output from the output circuit 118a is synchronized with the input/output clock signals LCLK.

Furthermore, the input/output clock signals LCLK are also supplied to a replica output circuit 20, which is included in the clock adjustment circuit 107. The replica output circuit 20 is a replica of the output circuit 118a. Therefore, the delay amount of the replica output circuit 20 is equal to the delay amount of the output circuit 118a. If an enable signal UDER is activated, the replica output circuit 20 generates internal clock signals RCLK, which have the same phases as those of the external clock signals CK, and internal clock signals FCLK, which have the same phases as those of the external clock signals /CK. The internal clock signals RCLK and FCLK are supplied to phase comparators 14R and 14F, respectively. If an enable signal UDER is not activated, each of the internal clock signals RCLK and FCLK is set at a low level. Therefore each of phase comparators 14R and 14F stops operation at this time.

The phase comparator 14R compares the phases of the rising edge of the external clock signal CK (the falling edge of the external clock signal /CK) and the rising edge of the internal clock signal RCLK. If the rising edge of the internal clock signal RCLK leads the rising edge of the external clock signal CK as a result of the comparison, the phase comparator 14R sets a control signal CNTDIRR as a first logical level (for example, low level). Conversely, if the rising edge of the internal clock signal RCLK lags the rising edge of the external clock signal CK, the phase comparator 14R sets the control signal CNTDIRR as a second logical level (for example, high level). The control signal CNTDIRR is supplied to a register 16R and a timing generator 15R. The register 16R can be formed by a shift register circuit or a counter circuit.

The phase comparator 14F compares the phases of the falling edge of the external clock signal CK (or the rising edge of the external clock signal /CK) and the falling edge of the internal clock signal FCLK. If the falling edge of the internal clock signal FCLK leads the falling edge of the external clock signal CK as a result of the comparison, the phase comparator 14F sets a control signal DLUPIF as a first logical level (for example, low level). Conversely, if the falling edge of the internal clock signal FCLK lags the falling edge of the external clock signal CK, the phase comparator 14F sets the control signal DLUPIF as a second logical level (for example, high level). The control signal DLUPIF is supplied to a selector 22.

The selector 22 receives the control signal DLUPIF from the phase comparator 14F and a control signal DCC from a duty ratio detector 21. The selector 22 selects one of the control signal DLUPIF and the control signal DCC based on a selection signal DCCEN and outputs the selected control signal as a control signal CNTDIRF. The control signal CNTDIRF is supplied to a register 16F and a timing generator 15F.

If an enable signal UDER is activated, the register 16R carries out renewal of a count value CNTR. Whether the count value CNTR is to be incremented or decremented is determined by the logical level of the control signal CNTDIRR. Specifically, if the control signal CNTDIRR is at the first logical level (for example, low level), the count value CNTR is incremented. Conversely, if the control signal CNTDIRR is at the second logical level (for example, high level), the count value CNTR is decremented. The count value CNTR consists of a higher bit CNTRU and a lower bit CNTRL. The higher bit CNTRU of the count value CNTR is supplied to the pre decoder 17R. The lower bit CNTRL of the count value CNTR is supplied to the D/A converter 18R. By virtue of this, the larger the count value CNTR, the larger the delay of the intermediate clock signal NR with respect to the internal clock signal ICLK.

If an enable signal UDEF is activated, the register 16F carries out renewal of a count value CNTF. Whether the count value CNTF is to be incremented or decremented is determined by the logical level of the control signal CNTDIRF. Specifically, if the control signal CNTDIRF is at the first logical level (for example, low level), the count value CNTF is incremented. Conversely, if the control signal CNTDIRF is at the second logical level (for example, high level), the count value CNTF is decremented. The count value CNTF consists of a higher bit CNTFU and a lower bit CNTFL. The higher bit CNTFU of the count value CNTF is supplied to the pre decoder 17F. The lower bit CNTFL of the count value CNTF is supplied to the D/A converter 18F. By virtue of this, the larger the count value CNTF, the larger the delay of the intermediate clock signal NF with respect to the internal clock signal ICLK.

The duty ratio detector 21 detects the duty ratio of the input/output clock signal LCLK. The result of the detection is output as the control signal DCC. Therefore, if the selection signal DCCEN is selecting the control signal DCC, the phase of the intermediate clock signal NF is controlled based on the duty ratio of the input/output clock signal LCLK. On the other hand, if the selection signal DCCEN is selecting the control signal DLUPIF, the phase of the intermediate clock signal NF is controlled based on the phase of the falling edge of the input/output clock signal LCLK.

The timing generator 15R receives the control signal CNTDIRR and generates the enable signal UDER based on that. The timing generator 15F receives the control signal CNTDIRF and generates the enable signal UDEF based on that. As described later, the timing generator 15R and the timing generator 15F can share part of the circuits thereof.

In a period in which the enable signal UDER is deactivated, the register 16R holds the newest count value CNTR. At this time, the count value CNTR is not changed. Therefore during the period the pre decoder 17R and the D/A converter 18R do not operate. Therefore the newest pre-decode signals PDECR and the newest bias voltages BIASRE and BIASRO are not changed. In a period in which the enable signal UDEF is deactivated, the register 16F holds the newest count value CNTF. At this time, the count value CNTF is not changed. Therefore in the period the pre decoder 17F and the D/A converter 18F do not operate. Therefore the newest pre-decode signals PDECF and the newest bias voltages BIASFE and BIASFO are not changed.

Among the circuits constituting the clock adjustment circuit 107, the circuits other than those of the phase comparators 14R and 14F and the timing generators 15R and 15F constitute a delay-amount renewal controller. For example, the variable delay circuits 12, 10R, and 10F, the registers 16R and 16F, etc. are part of the delay-amount renewal controller.

Figure 3:
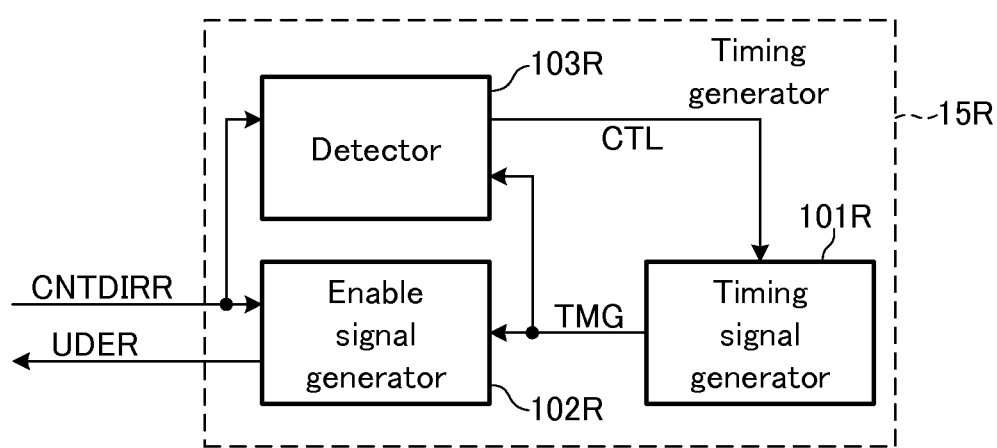
FIG. 3 is a block diagram showing a timing generator according to an embodiment of the invention.

FIG. 3 is a block diagram showing a timing generator 15R according to an embodiment of the invention.

As shown in FIG. 3, the timing generator 15R includes a timing signal generator 101R, an enable signal generator 102R, and a detector 103R. The timing signal generator 101R and the enable signal generator 102R constitute an enable-signal generating circuit.

The timing signal generator 101R activates a timing signal TMG at a predetermined cycle. The cycle in which the timing signal TMG is activated is controlled by a control signal CTL. The timing signal generator 101R can be formed by an oscillator circuit or a counter circuit. The timing signal TMG is input to the enable signal generator 102R and the detector 103R.

If the timing signal TMG is activated, the enable signal generator 102R activates the enable signal UDER. The control signal CNTDIRR is also input to the enable signal generator 102R. If the control signal CNTDIRR is changed in a predetermined pattern, the enable signal generator 102R deactivates the enable signal UDER. The predetermined pattern is a pattern in which the logical level of the control signal CNTDIRR is continuously inverted a predetermined number of times.

The detector 103R receives the control signal CNTDIRR and the timing signal TMG. If the detector 103R detects that the logical level of the control signal CNTDIRR is not changed for a certain period or more after the timing signal TMG is activated, the detector 103R changes the control signal CTL to the high level. On the other hand, if the detector 103R detects that the logical level of the control signal CNTDIRR is changed within the certain period after the timing signal TMG is activated, the detector 103R changes the control signal CTL to the low level. The detector 103R can be formed by a counter circuit which operates by the timing signal TMG.

Figure 4:
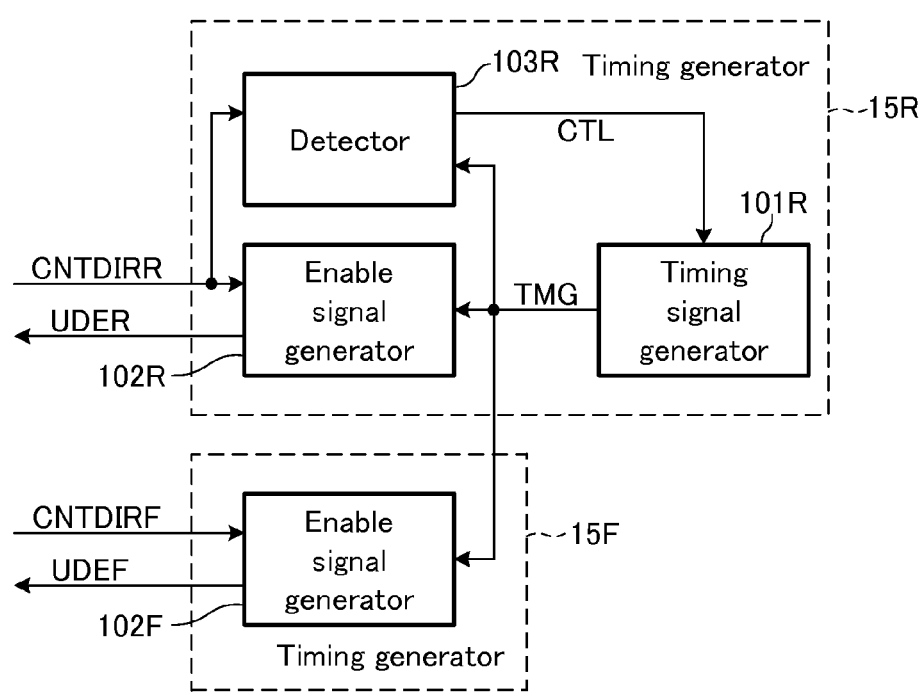
FIG. 4 is a block diagram showing a timing generator according to an embodiment of the invention.

The timing generator 15F can have a circuit configuration similar to that of the timing generator 15R shown in FIG. 3. Alternatively, as shown in FIG. 4, the timing generator 15F may be provided only with an enable signal generator 102F to omit the timing signal generator and the detector. In that case, the enable signal generator 102F activates the enable signal UDEF in response to the timing signal TMG. By virtue of this, the circuit configuration of the clock adjustment circuit 107 can be simplified.

Next, operations of the timing generator 15R will be explained.

Figure 5:
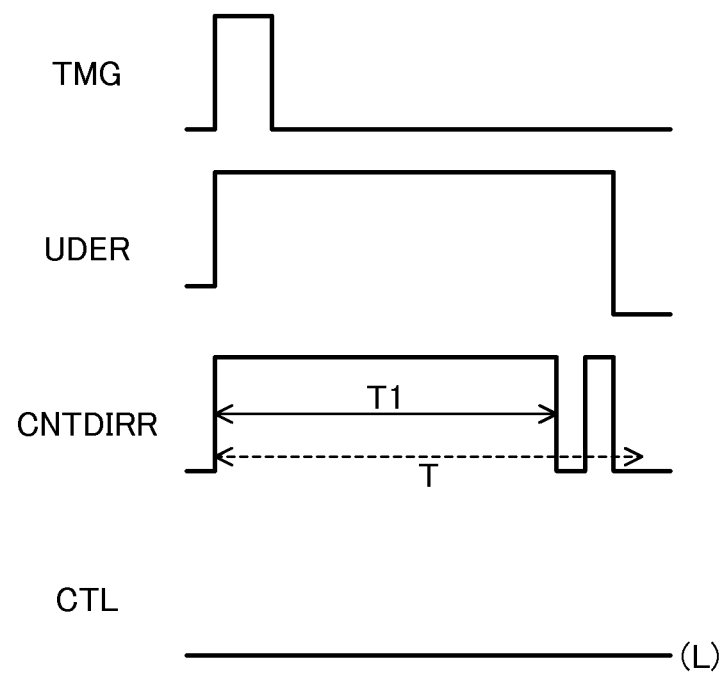
FIG. 5 is a timing chart for explaining an operation of a case that an operation environment is good and that the phase of an internal clock signal RCLK lags an external clock signal CK.

FIG. 5 shows an operation of a case that an operation environment is good and that the phase of the internal clock signal RCLK lags the external clock signal CK. Herein, the operation environment means a power-source voltage, a chip temperature, etc. If the operation environment is good, the phase difference between the external clock signal CK and the internal clock signal RCLK is small.

In the example shown in FIG. 5, if the enable signal UDER is activated in response to the timing signal TMG, the control signal CNTDIRR becomes the high level. This is for a reason that the delay of the internal clock signal RCLK is detected by the phase comparator 14R. In response to this, the register 16R decrements the count value CNTR and reduces the delay amount. Although not illustrated, this is similar also in a case of the register 16F, wherein the count value CNTF is decremented. Since the phases of the intermediate clock signals NR and NF are advanced by virtue of this, the delay in the phase of the internal clock signal RCLK with respect to the external clock signal CK is gradually reduced.

If the phase of the internal clock signal RCLK exceeds the phase of the external clock signal CK as a result of repeating such an operation, the control signal CNTDIRR is inverted to the low level. This is for a reason that the advance of the internal clock signal RCLK is detected by the phase comparator 14R. In response to this, the register 16R increments the count value CNTF and increases the delay amount. Although not illustrated, this is similar also in a case of the register 16F, wherein the count value CNTF is incremented. By virtue of this, the phases of the intermediate clock signals NR and NF are controlled to be delayed.

As a result, this time, control is carried out so that the control signal CNTDIRR is inverted to the high level again to reduce the delay amount. By virtue of this, this time, control is carried out so that the control signal CNTDIRR is inverted to the low level again to increase the delay amount. In this manner, the pattern in which the logical level of the control signal CNTDIRR is alternately inverted appears in a case in which the phase of the internal clock signal RCLK approximately matches the external clock signal CK. Such a pattern is detected by the enable signal generator 102R shown in FIG. 3. In response to the detection of the pattern, the enable signal generator 102R deactivates the enable signal UDER.

Thus, a series of phase adjustment operations are completed, and the delay amount of the clock adjustment circuit 107 is fixed. Therefore, the clock adjustment circuit 107 becomes a state in which current consumption is low. Then, if the timing signal TMG is activated again, the above described phase adjustment operations are restarted.

In the example shown in FIG. 5, a period T1 in which the control signal CNTDIRR maintains the high level is less than a threshold value T. Since this means that the phase adjustment operations are completed in a short period, it can be understood that the operation environment is good. In a case in which the operation environment is good, the phase difference between the external clock signal CK and the internal clock signal RCLK is not largely varied in a short period. Therefore, the frequency of activating the enable signal UDER may be low.

In such a case, the detector 103R sets the control signal CTL at the low level. More specifically, the detector 103R monitors the period in which the control signal CNTDIRR maintains one of the logical levels and, if this is less than the threshold value T, sets the control signal CTL to the low level. If the control signal CTL is at the low level, the timing signal generator 101R reduces the frequency of activating the timing signal TMG. In other words, an activation cycle of the timing signal TMG is extended. If the frequency of activating the enable signal UDER becomes low, the currents consumed by the clock adjustment circuit 107 can be reduced.

Figure 6:
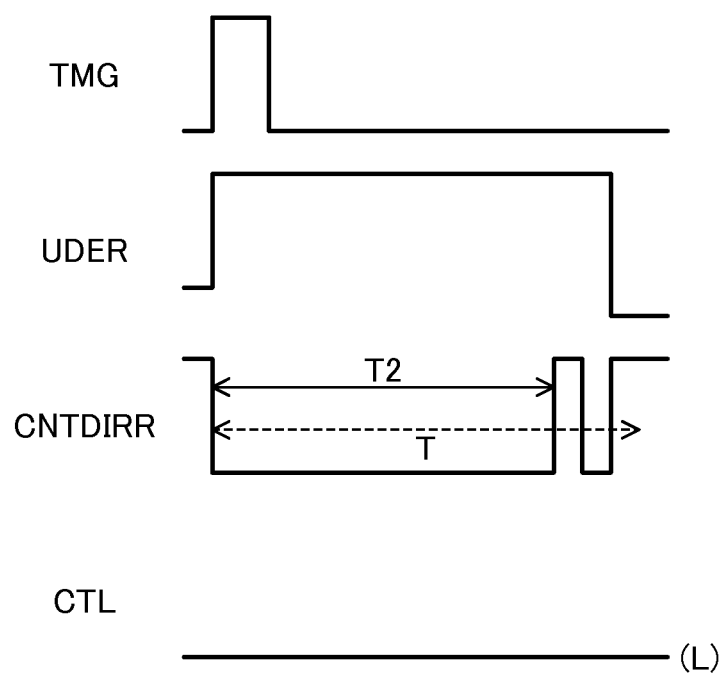
FIG. 6 is a timing chart for explaining an operation of a case that the operation environment is good and that the phase of the internal clock signal RCLK leads the external clock signal CK.

FIG. 6 shows an operation of a case that the operation environment is good and that the phase of the internal clock signal RCLK leads the external clock signal CK.

In the example shown in FIG. 6, opposite to the example shown in FIG. 5, if the enable signal UDER is activated in response to the timing signal TMG, the control signal CNTDIRR becomes the low level. This is for a reason that the advance of the internal clock signal RCLK is detected by the phase comparator 14R. In response to this, the register 16R increments the count value CNTR and increases the delay amount.

If the phase of the internal clock signal RCLK exceeds the phase of the external clock signal CK as a result of repeating such an operation, as explained by using FIG. 5, the pattern in which the logical level of the control signal CNTDIRR is alternately inverted appears. Such a pattern is detected by the enable signal generator 102R shown in FIG. 3. In response to the detection of the pattern, the enable signal generator 102R deactivates the enable signal UDER.

In the example shown in FIG. 6, a period T2 in which the control signal CNTDIRR maintains the low level is less than the threshold value T. Therefore, the detector 103R sets the control signal CTL at the low level. Since the frequency of activating the enable signal UDER becomes low by virtue of this, the currents consumed by the clock adjustment circuit 107 can be reduced.

Figure 7:
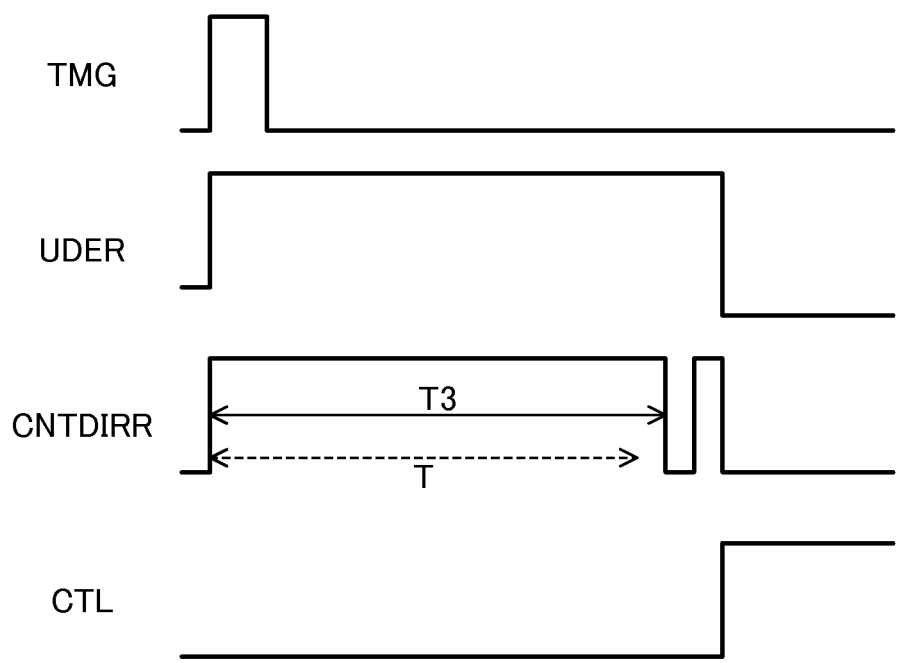
FIG. 7 is a timing chart for explaining an operation of a case that the operation environment is not good and that the phase of the internal clock signal RCLK lags the external clock signal CK.

FIG. 7 shows an operation of a case that the operation environment is not good and that the phase of the internal clock signal RCLK lags the external clock signal CK.

In the example shown in FIG. 7, as well as the example shown in FIG. 5, if the enable signal UDER is activated in response to the timing signal TMG, the control signal CNTDIRR becomes the high level. However, since the operation environment is not good in the example shown in FIG. 7, a period T3 in which the control signal CNTDIRR maintains the high level is equal to or more than the threshold value T. Since this means that a long period is required for the phase adjustment operations, it can be understood that the operation environment is not good. In the case in which the operation environment is not good, the phase difference between the external clock signal CK and the internal clock signal RCLK may be largely varied in a short period. Therefore, the enable signal UDER has to be activated at a high frequency.

In such a case, the detector 103R sets the control signal CTL at the high level. More specifically, the detector 103R monitors the period in which the control signal CNTDIRR maintains one of the logical levels and, if this is equal to or more than the threshold value T, sets the control signal CTL to the high level. If the control signal CTL is at the high level, the timing signal generator 101R increases the frequency of activating the timing signal TMG. In other words, the activation cycle of the timing signal TMG is shortened. If the frequency of activating the enable signal UDER is high, even in a case in which the operation environment is not good, the phase of the internal clock signal RCLK is not largely deviated from the phase of the external clock signal CK.

Figure 8:
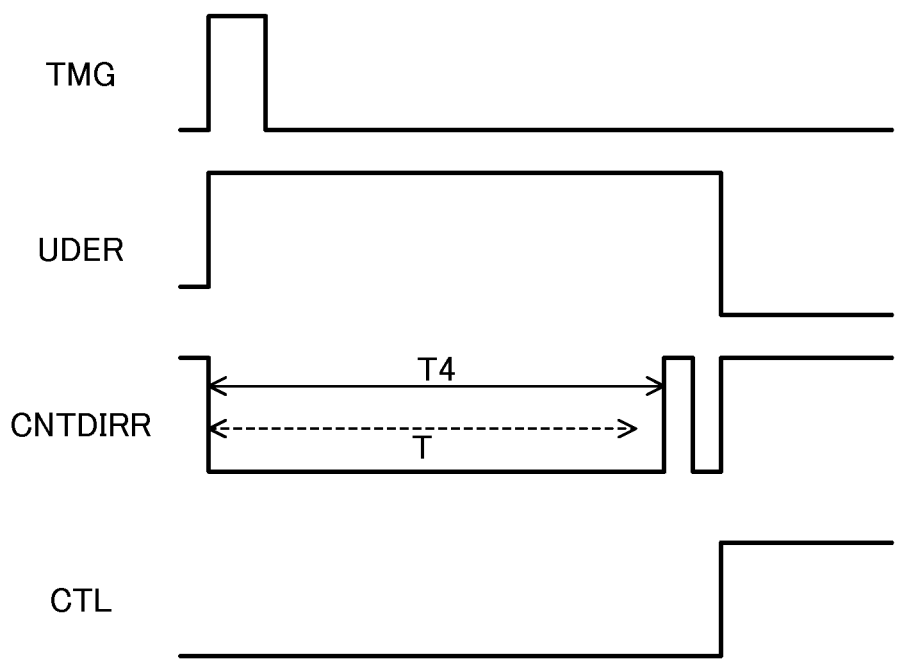
FIG. 8 is a timing chart for explaining an operation of a case that the operation environment is not good and that the phase of the internal clock signal RCLK leads the external clock signal CK.

FIG. 8 shows an operation of a case that the operation environment is not good and that the phase of the internal clock signal RCLK leads the external clock signal CK.

In the example shown in FIG. 8, opposite to the example shown in FIG. 7, if the enable signal UDER is activated in response to the timing signal TMG, the control signal CNTDIRR becomes the low level. This is for a reason that the advance of the internal clock signal RCLK is detected by the phase comparator 14R. In response to this, the register 16R increments the count value CNTR and increases the delay amount.

If the phase of the internal clock signal RCLK exceeds the phase of the external clock signal CK as a result of repeating such an operation, as explained by using FIG. 7, the pattern in which the logical level of the control signal CNTDIRR is alternately inverted appears. This pattern is detected by the enable signal generator 102R shown in FIG. 3. In response to the detection of the pattern, the enable signal generator 102R deactivates the enable signal UDER.

In the example shown in FIG. 8, a period T4 in which the control signal CNTDIRR maintains the low level is equal to or more than the threshold value T. Therefore, the detector 103R sets the control signal CTL to the high level. Since the frequency of activating the enable signal UDER becomes high by virtue of this, even in a case in which the operation environment is not good, the phase of the internal clock signal RCLK is not largely deviated from the phase of the external clock signal CK.

Figure 9:
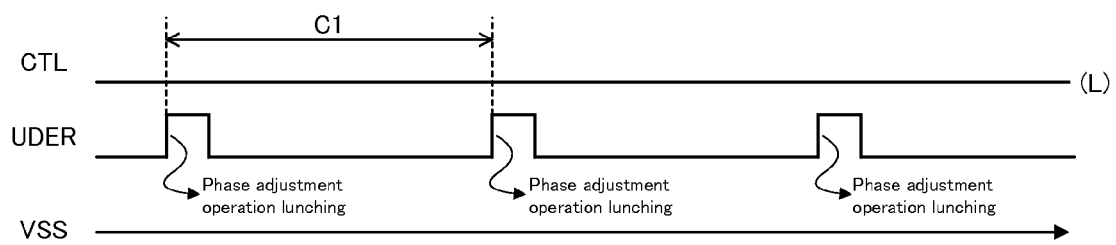
FIG. 9 is a timing chart for explaining an activation cycle of an enable signal UDER in a case that the operation environment is good.
Figure 10:
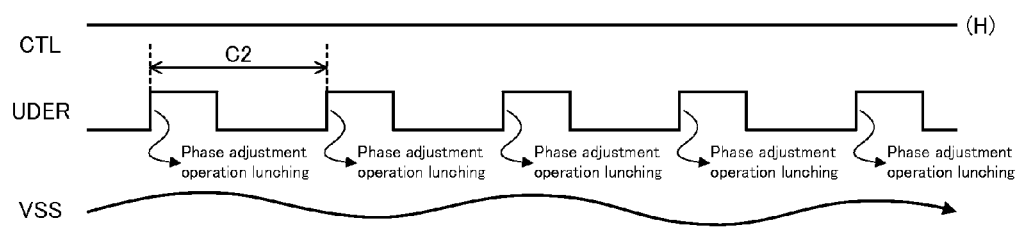
FIG. 10 is a timing chart for explaining an activation cycle of the enable signal UDER in a case that the operation environment is not good.
Figure 11:
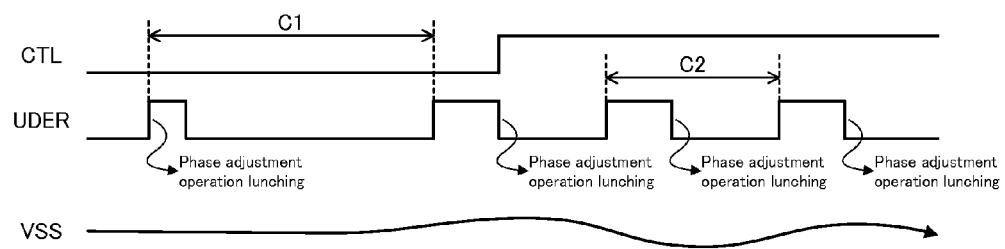
FIG. 11 is a timing chart for explaining an activation cycle of the enable signal UDER in a case that the operation environment is changed.

FIG. 9 to FIG. 11 are drawings for explaining the relation between the operation environment and the activation cycle of the enable signal UDER. Herein, a case in which a ground voltage VSS is varied is mentioned as an example of the case in which the operation environment is not good.

In the example shown in FIG. 9, the ground potential VSS is stable, and the operation environment is therefore good. In this case, the control signal CTL becomes the low level, and the activation frequency of the enable signal UDER therefore becomes low. In the example shown in FIG. 9, the enable signal UDER is activated by a cycle C1. By virtue of this, current consumption is reduced.

In the example shown in FIG. 10, the ground potential VSS is varied, and the operation environment is therefore not good. In this case, the control signal CTL becomes the high level, and the activation frequency of the enable signal UDER therefore becomes high. In the example shown in FIG. 10, the enable signal UDER is activated by a cycle C2 (>C1). By virtue of this, regardless of the variation of the ground potential VSS, the phase of the internal clock signal RCLK is not largely deviated from the phase of the external clock signal CK.

In the example shown in FIG. 11, the ground potential VSS is varied from the middle, and the operation environment is therefore changed from a good state to a not-good state. In this case, the control signal CTL is changed from the low level to the high level in accordance with the variation of the ground potential VSS. Therefore, the activation frequency of the enable signal UDER is switched from a low frequency to a high frequency. In this manner, the activation frequency of the enable signal UDER can be dynamically switched depending on the operation environment.

Figure 12:
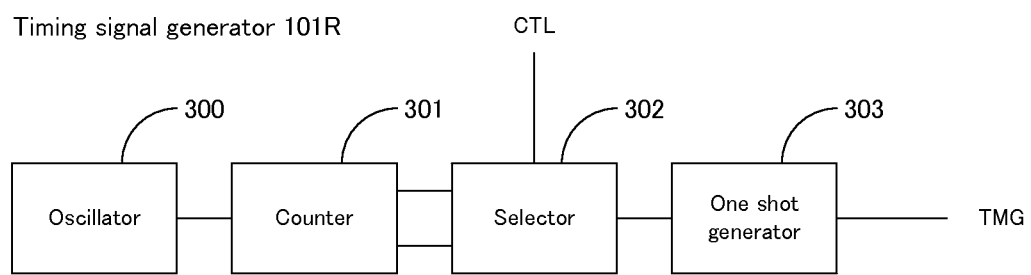
FIG. 12 is a block diagram showing a timing signal generator according to an embodiment of the invention.

In the example shown in FIG. 12, according to a timing signal generator 101R of the embodiment, an oscillator 300 generates a clock signal. A counter 301 divides the clock signal to generate frequency divided clock signals. A selector 302 selects one of the frequency divided clock signals in response to the control signal CTL. A one shot generator 303 generates one pulse signal in response to a selected one of the frequency divided clock signals.

Figure 13:
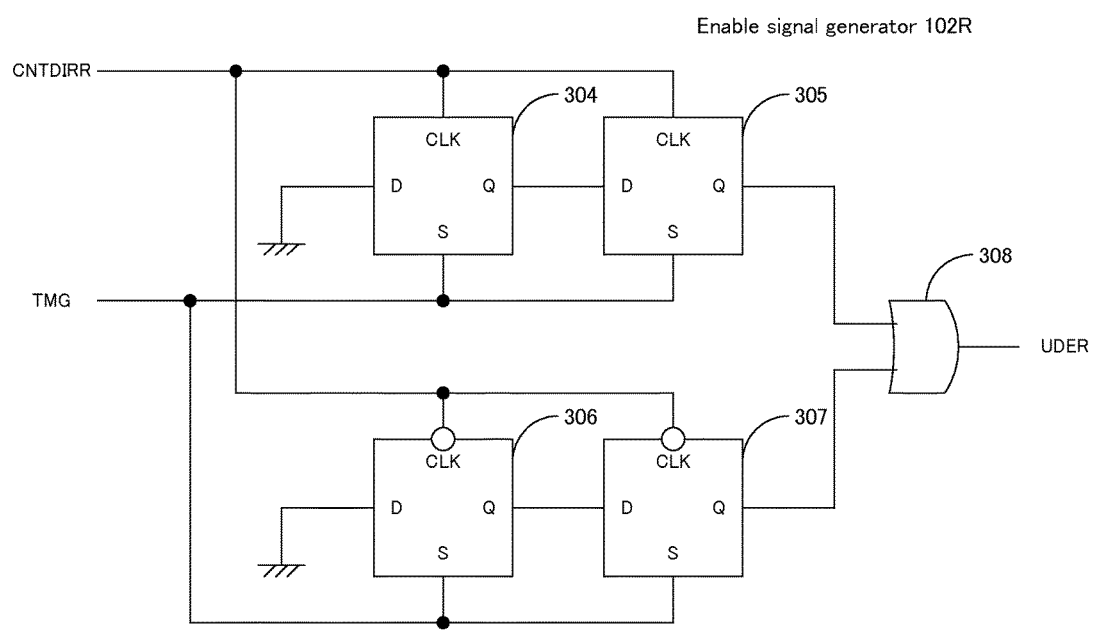
FIG. 13 is a block diagram showing an enable signal generator according to an embodiment of the invention.

In the example shown in FIG. 13, according to an enable signal generator 102R of the embodiment, when the timing signal TMG becomes a high logic level, all of output nodes of flip-flops 304-307 are set to high level. Then the enable signal UDER becomes a high logic level. When the control signal CNTDIRR becomes one of low and high logic levels two times, all of output nodes of flip-flops 304-307 are set to a low logic level. Then the enable signal UDER becomes a low logic level.

Figure 14:
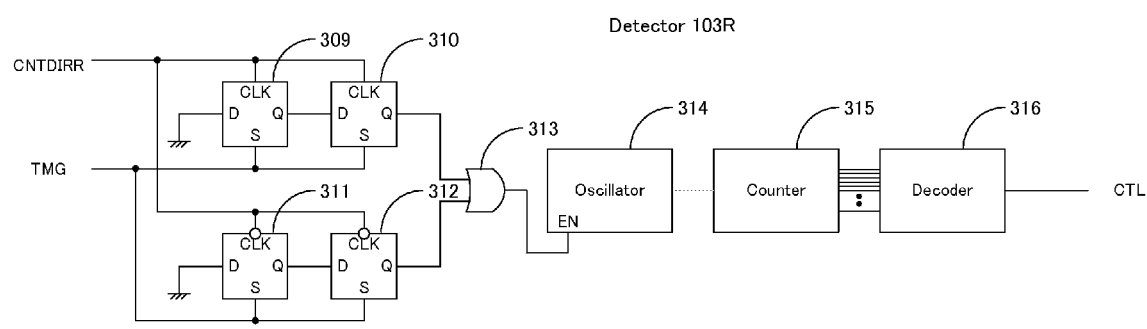
FIG. 14 is a block diagram showing a detector according to an embodiment of the invention.

In the example shown in FIG. 14, according to a decoder 103R of the embodiment, elements 309-313 are the same as elements 304-308 shown in FIG. 13 in operation. When an output signal of OR 313 is at a high level, an oscillator 314 can operate and output a clock signal. A counter 315 counts pulses of the clock signal and outputs a count value. A decoder 316 compares the count value with a threshold value and activates a control signal CTL when the count value is more than the threshold value. Here, for example, twenty pulses of the clock signal CK are contained in a period when the enable signal UDER is at the high level (when an output signal of OR 313 is at the high level). In this period, the oscillator 314 outputs ten pulses of the clock signal. The threshold value means eight pulses of the clock signal. Then the control signal CTL becomes the high level.

As explained above, in the example shown in FIG. 2, a clock circuit (a clock input circuit 106 and a clock adjustment circuit 107) is configured to receive clock signals CK, RCLK and perform a phase control operation in which a phase relationship between the clock signals CK, RCLK is controlled. The clock circuit is configured to initiate the phase control operation each time a control signal UDER is asserted. A phase comparator 14R is configured to produce a control signal CNTDIRR indicative of a phase difference between the clock signals CK, RCLK. A timing generator 15R is configured to assert the control signal UDER cyclically. The timing generator 15R is configured to respond to the control signal CNTDIRR to control a cycle of producing the control signal UDER. The phase control operation is performed in a manner of DLL (Delay Locked Loop).

In the example shown in FIG. 3, 4, the timing generator 15R includes an enable signal generator 102R that is configured to initiate the phase control operation responsive to the control signal UDER being asserted and terminate the phase control operation responsive to the control signal CNTDIRR indicating that the clock signals CK, RCLK are in phase. The timing generator 15R includes a detector 103R that is configured to activate a control signal CTL when the control signal CNTDIRR indicates that the clock signals CK, RCLK are out of phase over a period T. The period T includes a plurality of consecutive pulses of the clock signal CK. The timing generator 15R includes a timing signal generator 101R that is configured to produce the control signal UDER in a first cycle during the control signal CTL being activated and in a second cycle during the control signal CTL being deactivated in the example shown in FIG. 9-11. The first cycle is smaller than the second cycle.

The control signal CNTDIRR indicates that the clock signals CK, RCLK are in phase by changing a logic state thereof between high and low levels. The control signal CNTDIRR indicates that the clock signals CK, RCLK are out of phase over the period T by keeping a logic state thereof unchanged.

As explained above, in the example shown in FIG. 2, a DLL (Delayed Locked Loop) circuit (a clock input circuit 106 and a clock adjustment circuit 107) is configured to perform a DLL operation on clock signals CK, RCLK. The DLL circuit is configured to initiate the DLL operation each time a control signal UDER is asserted. The DLL circuit is configured to terminate the DLL operation responsive to a control signal CNTDIRR indicating that the clock signals CK, RCLK are in phase. A phase comparator 14R is configured to produce the control signal CNTDIRR indicative of a phase difference between the clock signals CK, RCLK. A timing generator 15R is configured to make, after making a first assertion of the control signal UDER, a second assertion of the control signal UDER in a selected one of first and second time periods. The first and second time periods are different from each other. A selection of the first time period or the second time period is made in response to the control signal CNTDIRR. The timing generator 15R is configured to detect a period of time during which the clock signals CK, RCLK are out of phase. The first time period is larger than the second time period.

The second assertion of the control signal UDER is made in the first time period when the period of time in the DLL operation responsive to the first assertion of the control signal UDER is detected to be equal or smaller than a first value T. The second assertion of the control signal UDER is made the second time period when the period of time in the DLL operation responsive to the first assertion of the control signal UDER is detected to be larger than the first value T in the example shown in FIG. 9-11. The second assertion of the control signal UDER is made in the first time period when a period of time during which the clock signals CK, RCLK are out of phase in the DLL operation responsive to the first assertion of the control signal UDER is detected to be equal or smaller than a first value T. The second assertion of the control signal UDER is made in the second time when the period of time is detected to be larger than the first value T in the example shown in FIG. 9-11.

As explained above, a timing generator 15R is configured to make a first assertion of a control signal UDER. A DLL (Delayed Locked Loop) circuit (a clock input circuit 106 and a clock adjustment circuit 107) is configured to initiate a first phase control operation to control a phase relationship between clock signals CK, RCLK responsive to the first assertion of the control signal UDER. A timing generator 15R is configured to terminate the first phase control operation when the clock signals CK, RCLK are in phase. A timing generator 15R is configured to make a second assertion of the control signal UDER after a first time period when a condition in which the clock signals CK, RCLK are out of phase in the first phase control operation continues over a first period T, and in a second time when the condition ends within the first period T in the example shown in FIG. 9-11. A DLL circuit is configured to initiate a second first phase control operation to control a phase relationship between the clock signals CK, RCLK responsive to the second assertion of the control signal UDER. The first time period is smaller than the second time period.

A phase comparator 14R is configured to produce a control signal CNTDIRR indicative of a phase difference between the clock signals CK, RCLK. A timing generator 15R is configured to judge a state of the control signal CNTDIRR to detect whether the clock signals CK, RCLK are in phase or out of phase. The control signal CNTDIRR has a first state to indicate the clock signals CK, RCLK are in phase and has a second state to indicate the clock signals CK, RCLK are out of phase.

As explained above, according to the semiconductor device 100 of the present embodiment, the clock adjustment circuit 107 is intermittently operated; therefore, while reducing the current consumption, the internal clock signal LCLK can be correctly subjected to phase adjustment. Moreover, since the intermittent operation frequency is dynamically switched depending on the operation environment, the current consumption can be further reduced. Moreover, since the intermittent operation frequency is automatically changed, there is no need to issue, for example, a mode-register-set command from outside for changing the operation frequency from outside.

Hereinabove, embodiments of the present invention have been explained. However, the present invention is not limited to the above described embodiments, and various modifications can be made within a range without departing from the scope of the present invention, and it goes without saying that they are included within the range of the present invention.

For example, in the above described embodiment, the activation frequencies of the enable signals UDR and UDEF are switched in two levels depending on the operation environment. However, they may be switched in three or more levels, or may be switched without levels (linearly). Alternatively, an operation mode in which the enable signals UDER and UDEF are always activated may be provided.

Moreover, in the examples shown in FIG. 5 to FIG. 8, the pattern in which the logical level of the control signal CNTDIRR is continuously inverted three times is detected by the enable signal generator 102R. However, the present invention is not limited to this. For example, a pattern in which the logical level of the control signal CNTDIRR is inverted once may be detected by the enable signal generator 102R.

What is claimed is:
1. An apparatus comprising:
a clock circuit configured to receive first and second clock signals and perform a phase control operation in which a phase relationship between the first and second clock signals is controlled, the clock circuit configured to initiate the phase control operation each time a first control signal is asserted, the clock circuit including a comparator circuit that is configured to produce a second control signal indicative of a phase difference between the first and second clock signals; and a timing generator configured to assert the first control signal cyclically, the timing generator configured to respond to the second control signal to adjust a frequency of a cycle of producing the first control signal to initiate the phase control operation.

2. The apparatus as claimed in claim 1, wherein the phase control operation is performed in a manner of a DLL (Delay Locked Loop).

3. The apparatus as claimed in claim 1, wherein the timing generator includes an enable signal generator that is configured to initiate the phase control operation responsive to a timing signal being activated and terminate the phase control operation responsive to the second control signal indicating that the first and second clock signals are in phase.

4. The apparatus as claimed in claim 3, wherein the second control signal indicates, by changing a logic state thereof between first and second logic levels, that the first and second clock signals are in phase.

5. The apparatus as claimed in claim 3, wherein the timing generator includes a detector that is configured to activate a third control signal when the second control signal indicates that the first and second clock signals are out of phase over a period that includes a plurality of consecutive pulses of the first clock signal.

6. The apparatus as claimed in claim 5, wherein the second control signal indicates, by keeping a logic state thereof unchanged, that the first and second clock signals are out of phase over the period that includes a plurality of consecutive pulses of the first clock signal.

7. An apparatus comprising:
a clock circuit configured to receive first and second clock signals and perform a phase control operation in which a phase relationship between the first and second clock signals is controlled, the clock circuit configured to initiate the phase control operation each time a first control signal is asserted, the clock circuit including a comparator circuit that is configured to produce a second control signal that indicates, by keeping a logic state thereof unchanged, that the first and second clock signals are out of phase over the period that includes a plurality of consecutive pulses of the first clock signal; and a timing generator configured to assert the first control signal cyclically, the timing generator configured to respond to the second control signal to control a cycle of producing the first control signal, wherein the timing generator includes an enable signal generator that is configured to initiate the phase control operation responsive to a timing signal being activated and terminate the phase control operation responsive to the second control signal indicating that the first and second clock signals are in phase and further includes a detector that is configured to activate a third control signal when the second control signal indicates that the first and second clock signals are out of phase over a period that includes a plurality of consecutive pulses of the first clock signal, wherein the enable signal generator is configured to produce the first control signal in a first cycle during the third control signal being activated and in a second cycle during the third control signal being deactivated.

8. The apparatus as claimed in claim 7, wherein the first cycle is smaller than the second cycle.

9. An apparatus comprising:
a DLL (Delayed Locked Loop) circuit configured to perform a DLL operation on first and second clock signals, the DLL circuit configured to initiate the DLL operation each time a first control signal is asserted, the DLL circuit including a phase comparator circuit that is configured to produce a second control signal indicative of a phase difference between the first and second clock signals; and a timing generator configured to make, after making a first assertion of the first control signal, a second assertion of the first control signal in a selected one of first and second time periods, the first time period longer than the second time period, a selection of the first time period or the second time period being made based on a period of time during which the first and second clock signals are being out of phase in the DLL operation as indicated by the second control signal.

10. The apparatus as claimed in claim 9, wherein the DLL circuit is configured to terminate the DLL operation responsive to the second control signal indicating that the first and second clock signals are in phase.

11. The apparatus as claimed in claim 10, wherein the timing generator is configured to detect a period of time during which the first and second clock signals are out of phase.

12. An apparatus comprising:
a DLL (Delayed Locked Loop) circuit configured to perform a DLL operation on first and second clock signals, the DLL circuit configured to initiate the DLL operation each time a first control signal is asserted, the DLL circuit including a phase comparator circuit that is configured to produce a second control signal indicative of a phase difference between the first and second clock signals, the DLL circuit further configured to terminate the DLL operation responsive to the second control signal indicating that the first and second clock signals are in phase; and a timing generator configured to detect a period of time during which the first and second clock signals are out of phase and further configured to make, after making a first assertion of the first control signal, a second assertion of the first control signal in a selected one of first and second time periods, the first and second time periods being different from each other, a selection of the first time period or the second time period being made responsive to the second control signal, wherein the first time period is larger than the second time period and the second assertion of the first control signal is made in the first time period when the period of time in the DLL operation responsive to the first assertion of the first control signal is detected to be equal or smaller than a first value, and the second assertion of the first control signal is made in the second time period when the period of time in the DLL operation responsive to the first assertion of the first control signal is detected to be larger than the first value.

13. The apparatus as claimed in claim 12, wherein the first value corresponds to a period that includes a plurality of consecutive pulses of the first clock signal.

14. The apparatus as claimed in claim 13, wherein the first clock signal is supplied from outside of the apparatus and the second clock signal is produced inside of the apparatus.

15. An apparatus comprising:
a DLL (Delayed Locked Loop) circuit configured to perform a DLL operation on first and second clock signals, the DLL circuit configured to initiate the DLL operation each time a first control signal is asserted, the DLL circuit including a phase comparator circuit that is configured to produce a second control signal indicative of a phase difference between the first and second clock signals; and
a timing generator configured to make, after making a first assertion of the first control signal, a second assertion of the first control signal in a selected one of first and second time periods, the first and second time periods being different from each other, a selection of the first time period or the second time period being made responsive to the second control signal, wherein the first time period is larger than the second time period and the second assertion of the first control signal is made in the first time period when a period of time during which the first and second clock signals are being out of phase in the DLL operation responsive to the first assertion of the first control signal is detected to be equal or smaller than a first value, and the second assertion of the first control signal is made in the second time period when the period of time is detected to be larger than the first value.

16. A method comprising:
making a first assertion of a first control signal;
initiating a first phase control operation to control a phase relationship between first and second clock signals responsive to the first assertion of the first control signal;
terminating the first phase control operation when the first and second clock signals are in phase;
making a second assertion of the first control signal after a first time period when a condition in which the first and second clock signals are out of phase in the first phase control operation continues over a first period, and after a second time period when the condition ends within the first period, wherein the second time period is longer than the first time period; and
initiating a second phase control operation to control a phase relationship between the first and second clock signals responsive to the second assertion of the first control signal.

17. The method as claimed in claim 16, wherein each of the first and second phase control operation is performed in a DLL (Delay Locked Loop) manner.

18. The method as claimed in claim 17, wherein the first time period is smaller than the second time period.

19. The method as claimed in claim 18, wherein the method comprises:
producing a second control signal indicative of a phase difference between the first and second clock signals; and
judging a state of the second control signal to detect whether the first and second clock signals are in phase or out of phase.

20. The method as claimed in claim 19, wherein the second control signal takes a first state to indicate the first and second clock signals are in phase and a second state to indicate the first and second clock signals are out of phase.

* * * * *